United States Patent
Xie et al.

(10) Patent No.: US 9,472,446 B2
(45) Date of Patent: Oct. 18, 2016

(54) METHODS OF FORMING A FINFET SEMICONDUCTOR DEVICE WITH A UNIQUE GATE CONFIGURATION, AND THE RESULTING FINFET DEVICE

(71) Applicants: GLOBALFOUNDRIES Inc., Grand Cayman (KY); International Business Machines Corporation, Armonk, NY (US)

(72) Inventors: Ruilong Xie, Niskayuna, NY (US); Xiuyu Cai, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

( * ) Notice: Subject to any disclaimer, the term of this patent is extended or adjusted under 35 U.S.C. 154(b) by 46 days.

(21) Appl. No.: 14/307,902

(22) Filed: Jun. 18, 2014

(65) Prior Publication Data
US 2015/0371892 A1 Dec. 24, 2015

(51) Int. Cl.
| | |
|---|---|
| H01L 21/336 | (2006.01) |
| H01L 21/762 | (2006.01) |
| H01L 29/78 | (2006.01) |
| H01L 29/66 | (2006.01) |
| H01L 29/51 | (2006.01) |
| H01L 29/10 | (2006.01) |
| H01L 21/306 | (2006.01) |
| H01L 21/3065 | (2006.01) |
| H01L 21/308 | (2006.01) |
| H01L 21/84 | (2006.01) |
| H01L 21/8238 | (2006.01) |
| H01L 21/8234 | (2006.01) |

(52) U.S. Cl.
CPC ..... *H01L 21/76224* (2013.01); *H01L 21/3065* (2013.01); *H01L 21/3083* (2013.01); *H01L 21/30608* (2013.01); *H01L 21/823431* (2013.01); *H01L 21/823821* (2013.01); *H01L 21/845* (2013.01); *H01L 29/1029* (2013.01); *H01L 29/51* (2013.01); *H01L 29/66545* (2013.01); *H01L 29/66795* (2013.01); *H01L 29/66818* (2013.01); *H01L 29/785* (2013.01); *H01L 29/7853* (2013.01)

(58) Field of Classification Search
CPC ............... H01L 21/845; H01L 21/823431; H01L 21/823821; H01L 29/42392; H01L 29/66545; H01L 29/66795; H01L 29/6681; H01L 29/66818; H01L 29/785
USPC .......... 438/283, 157, 197, 156; 257/E21.444
See application file for complete search history.

(56) References Cited

U.S. PATENT DOCUMENTS

| | | | |
|---|---|---|---|
| 7,407,847 B2 * | 8/2008 | Doyle | H01L 29/7853 438/164 |
| 8,901,607 B2 * | 12/2014 | Wang | H01L 29/785 257/192 |
| 2014/0197457 A1 * | 7/2014 | Wang | H01L 29/785 257/192 |

*Primary Examiner* — Michael Trinh
(74) *Attorney, Agent, or Firm* — Amerson Law Firm, PLLC

(57) ABSTRACT

One method disclosed includes, among other things, forming an overall fin structure having a stepped cross-sectional profile, the fin structure having an upper part and a lower part positioned under the upper part, wherein the upper part has a first width and the lower part has a second width that is less than the first width, forming a layer of insulating material in trenches adjacent the overall fin structure such that the upper part of the overall fin structure and a portion of the lower part of the overall fin structure are exposed above an upper surface of the layer of insulating material, and forming a gate structure around the exposed upper part of the overall fin structure and the exposed portion of the lower part of the overall fin structure.

16 Claims, 17 Drawing Sheets

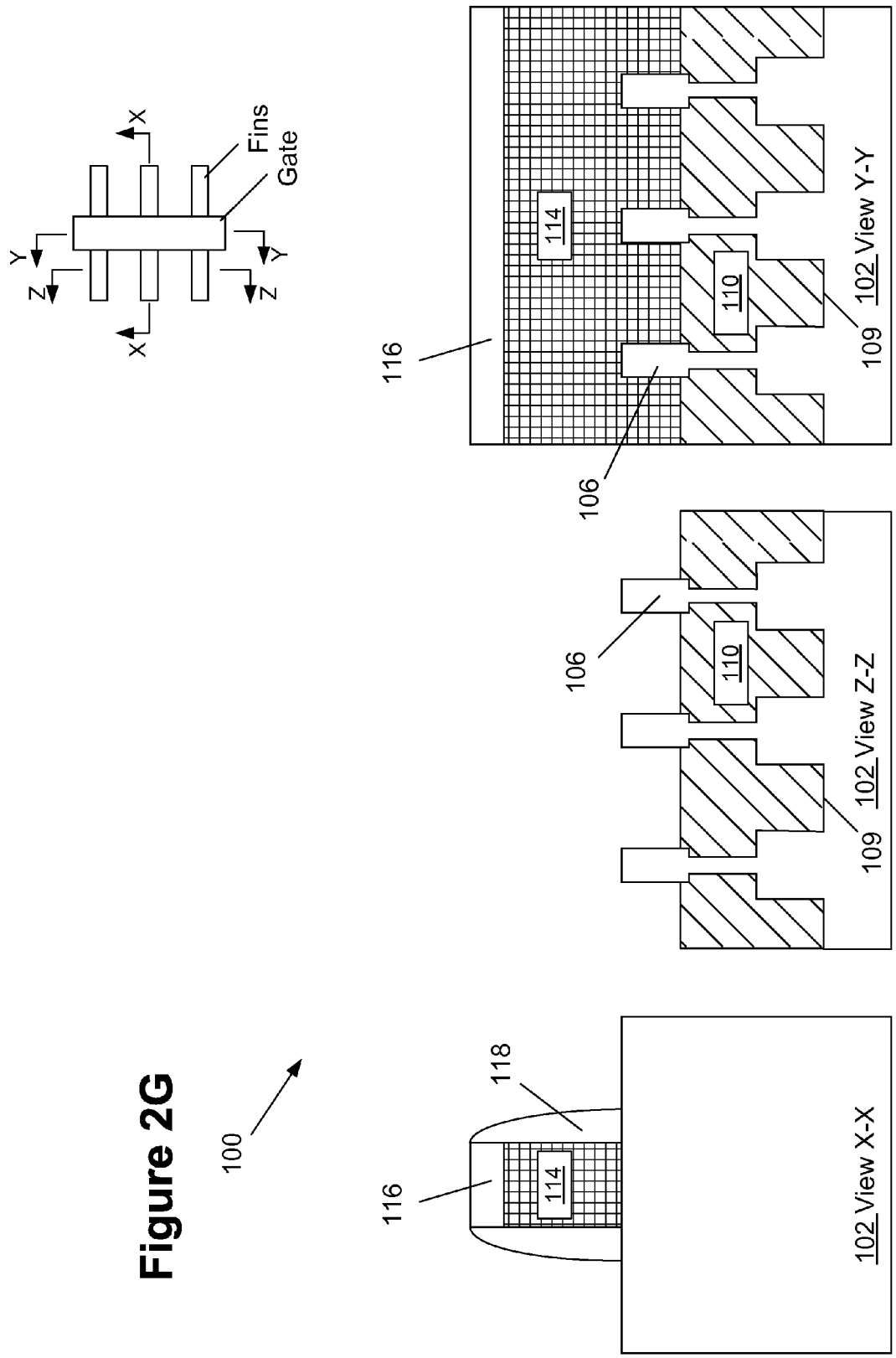

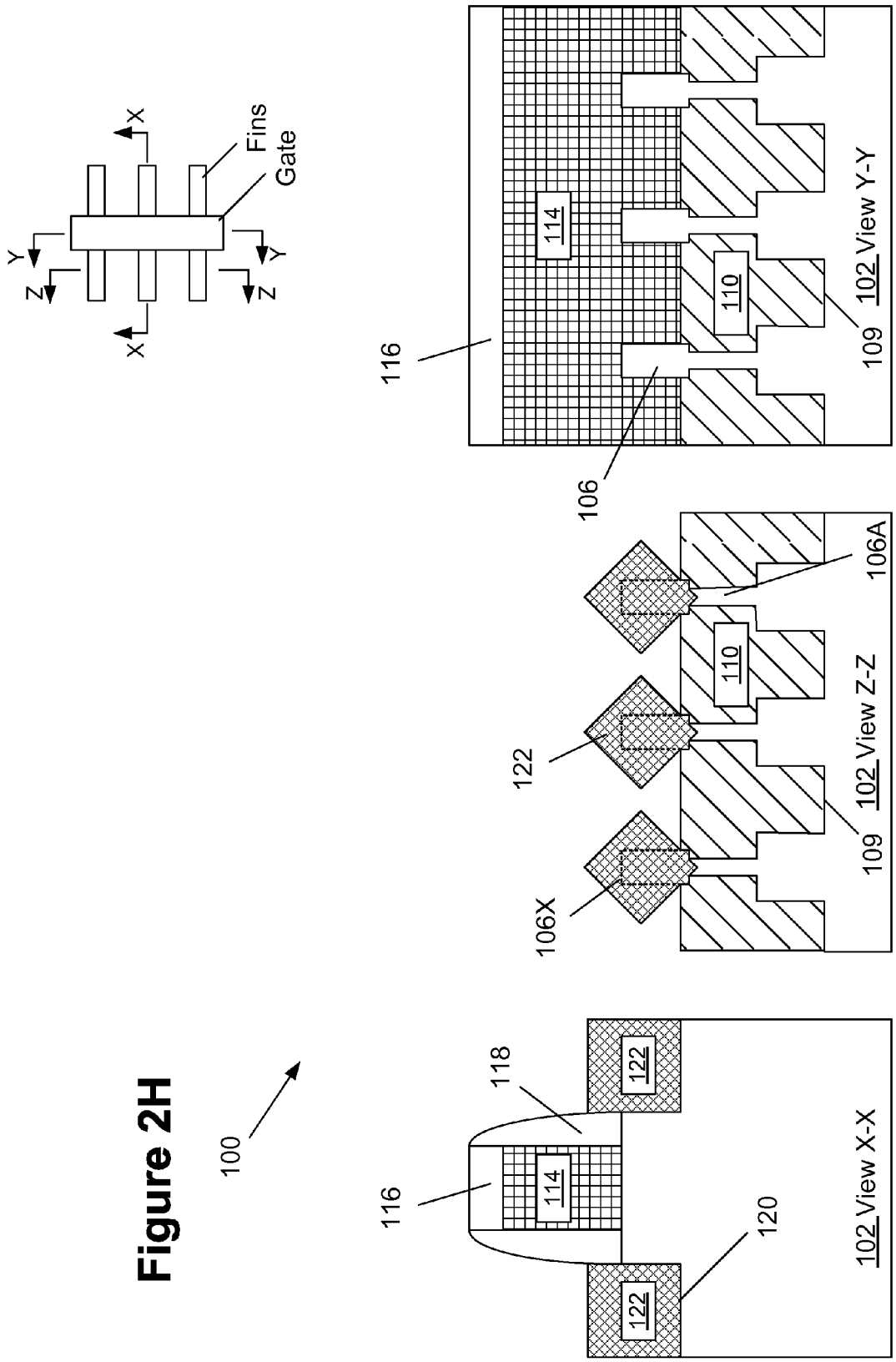

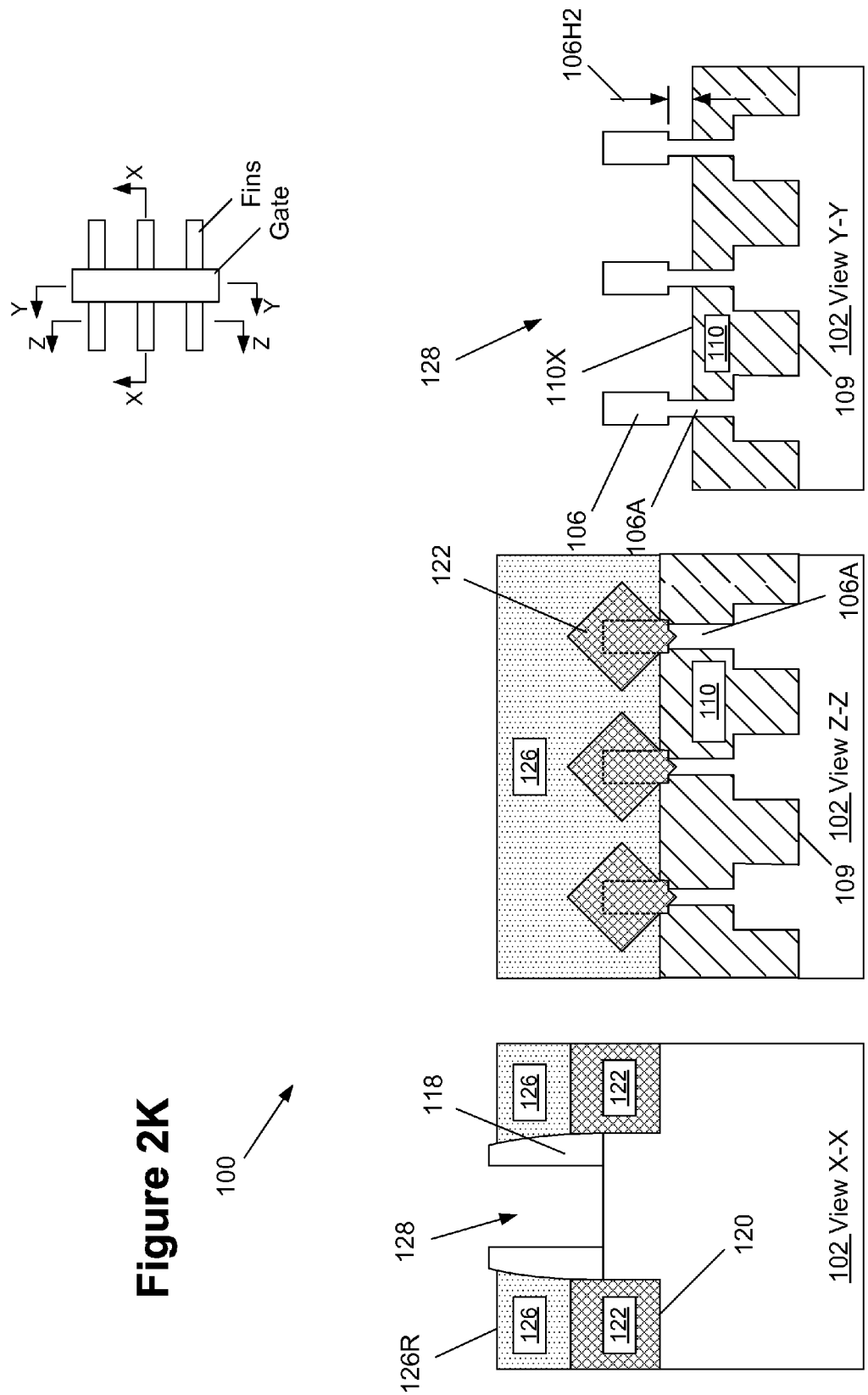

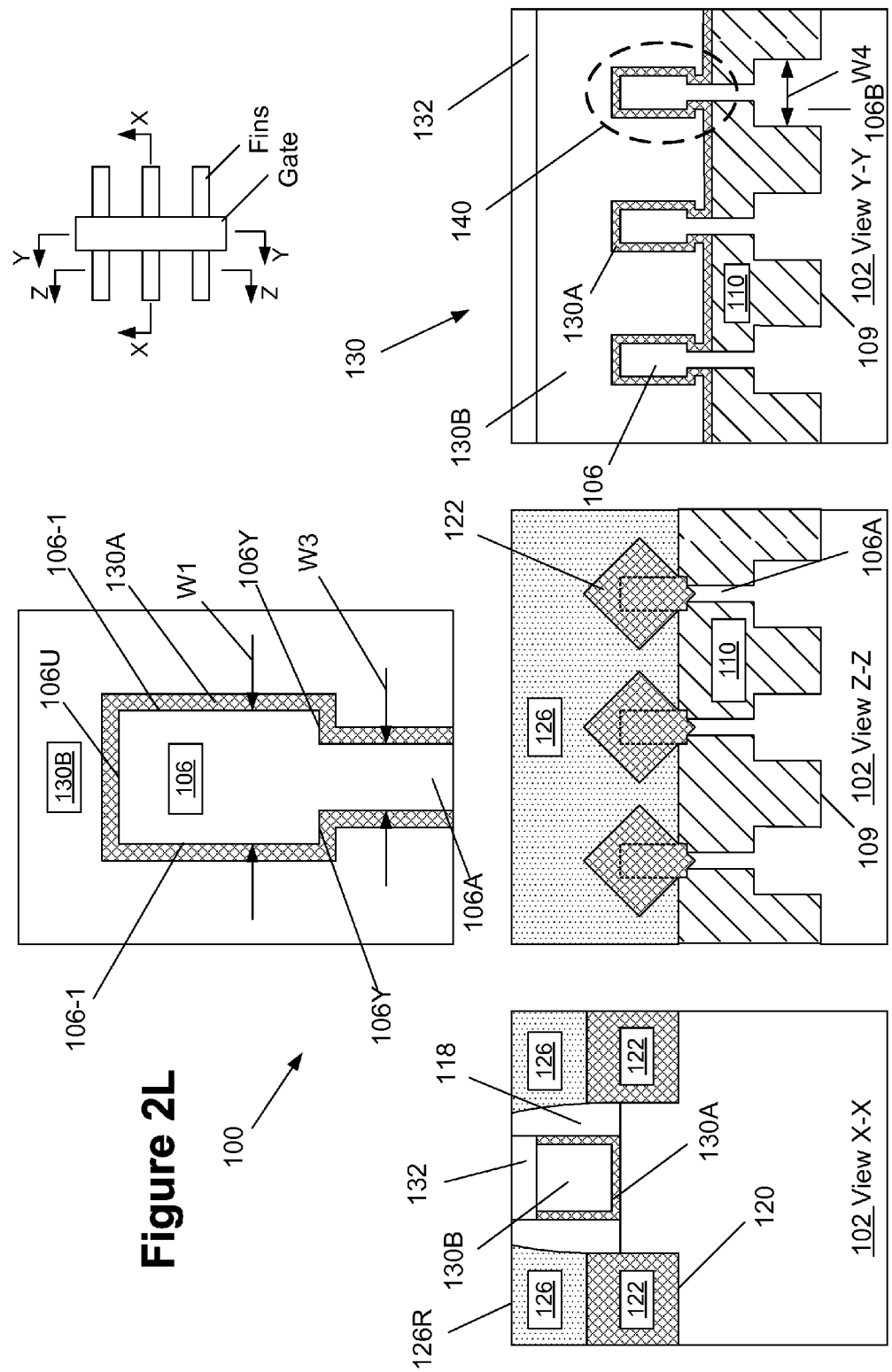

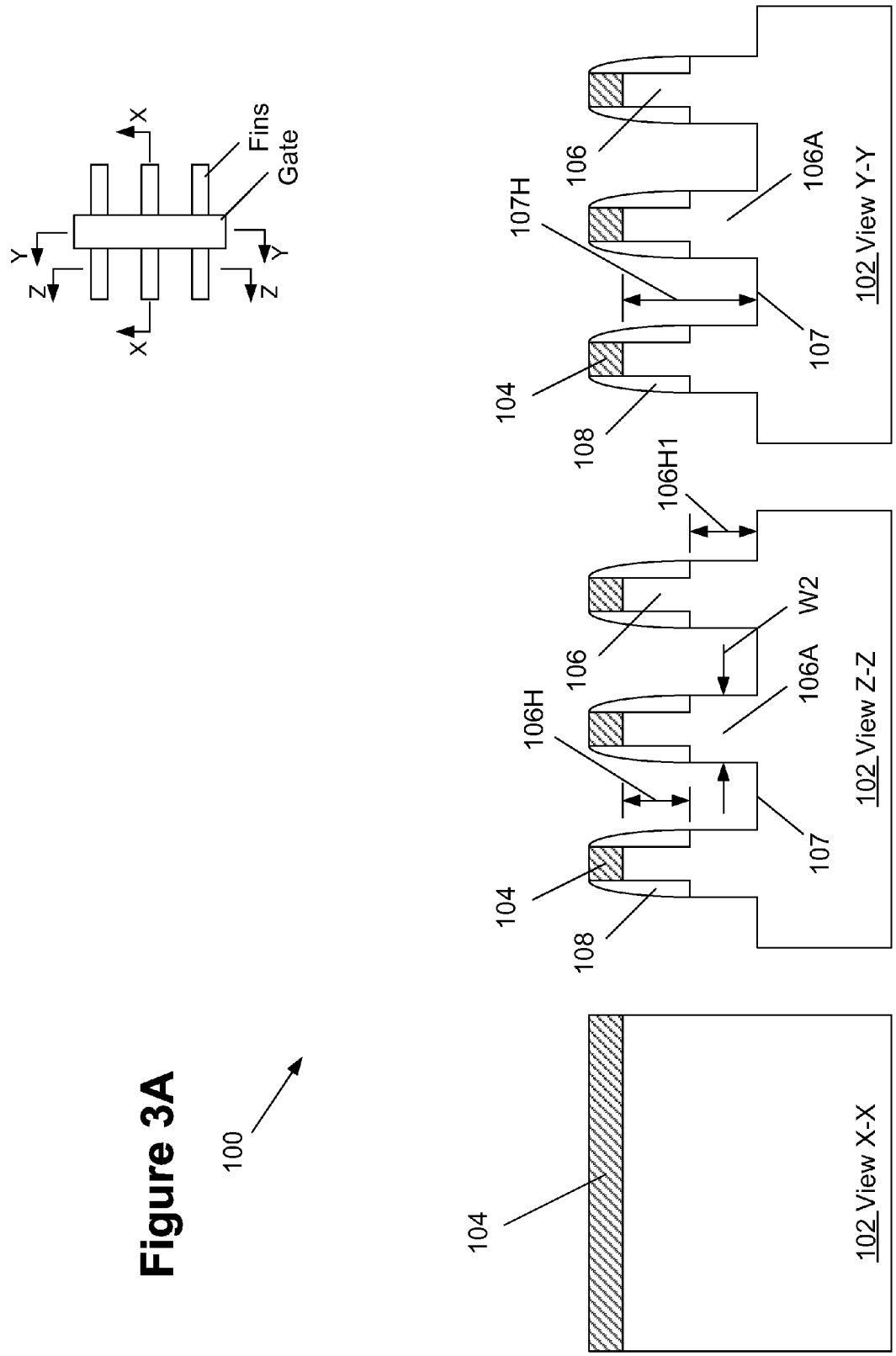

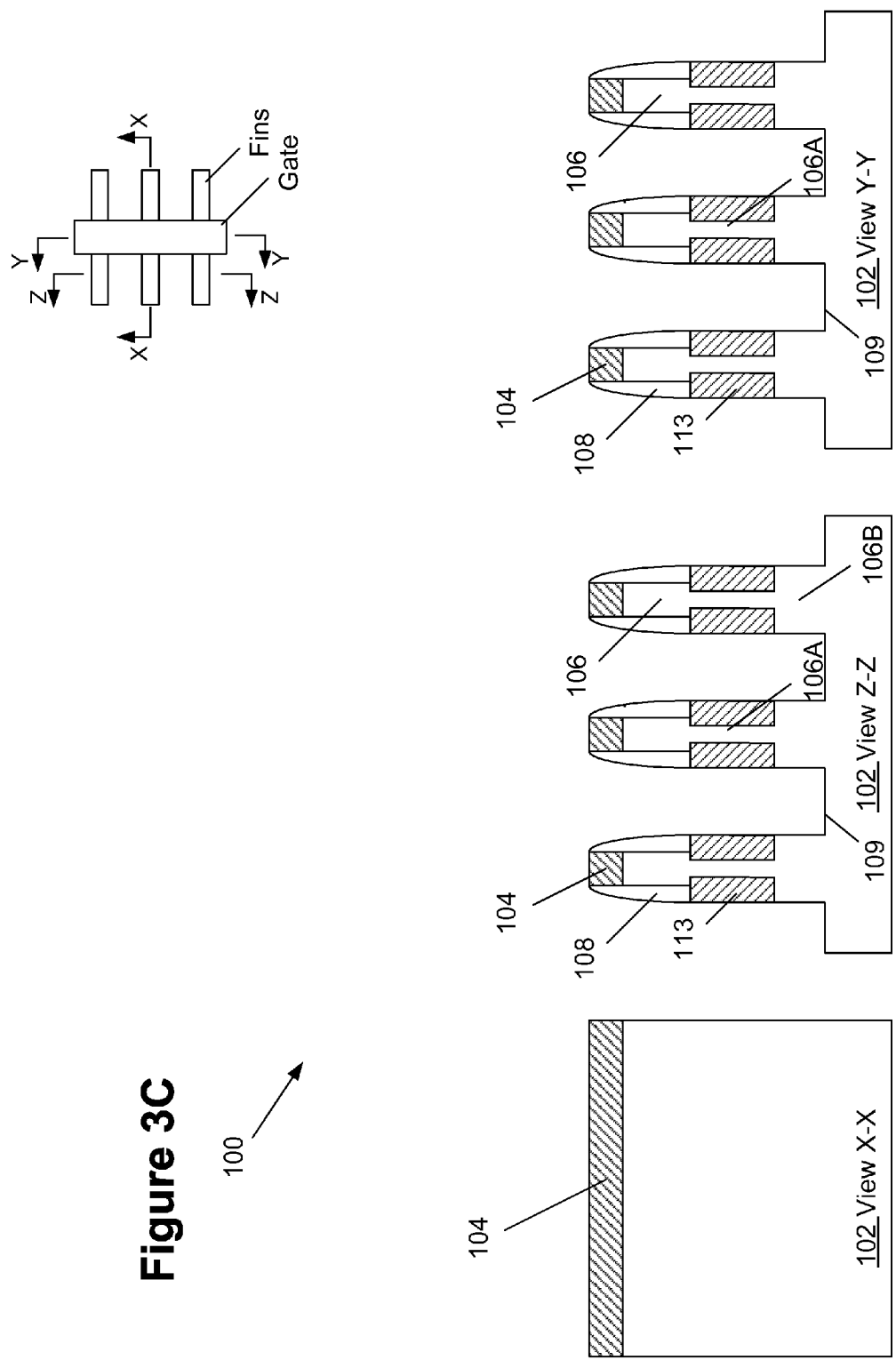

METHODS OF FORMING A FINFET SEMICONDUCTOR DEVICE WITH A UNIQUE GATE CONFIGURATION, AND THE RESULTING FINFET DEVICE

BACKGROUND OF THE INVENTION

1. Field of the Invention

The present disclosure generally relates to the fabrication of integrated circuits, and, more particularly, to various methods of forming a FinFET device with a unique gate configuration, and the resulting FinFET semiconductor device.

2. Description of the Related Art

The fabrication of advanced integrated circuits, such as CPU's, storage devices, ASIC's (application specific integrated circuits) and the like, requires the formation of a large number of so-called metal oxide field effect transistors (MOSFETs or FETs). A transistor includes a source region, a drain region, a channel region that is positioned between the source region and the drain region, and a gate electrode positioned above the channel region that is separated therefrom by a gate insulation layer. Current flow between the source and drain regions of the FET device is controlled by controlling the voltage applied to the gate electrode.

Transistors come in a variety of configurations. A conventional FET is a planar device, wherein the transistor is formed in and above an active region having a substantially planar upper surface. In contrast to a planar FET, there are so-called 3D devices, such as an illustrative FinFET device, which is a three-dimensional structure. FIG. 1 is a perspective view of an illustrative prior art FinFET semiconductor device 10 that is formed above a semiconductor substrate 12. The device 10 includes three illustrative fins 14, a gate structure 16, sidewall spacers 18 and a gate cap layer 20. The gate structure 16 is typically comprised of a layer of insulating material (not separately shown), e.g., a layer of high-k insulating material, and one or more conductive material layers that serve as the gate electrode for the device 10. The fins 14 have a three dimensional configuration: a height H, a width W and an axial length L. The axial length L corresponds to the direction of current travel in the device 10 when it is operational. The portions of the fins 14 covered by the gate structure 16 are the channel regions of the FinFET device 10. The portions of the fins 14 that are positioned outside of the spacers 18 are the source/drain regions of the device 10.

Unlike a planar FET, in a FinFET device, a channel is formed perpendicular to a surface of the semiconducting substrate so as to increase the drive current per footprint of the device. Also, in a FinFET device, the improved gate control through multiple gates on a narrow, fully-depleted semiconductor fin significantly reduces undesirable short channel effects. When an appropriate voltage is applied to the gate electrode 16 of a FinFET device 10, the surfaces (and the inner portion near the surface) of the fins 14, i.e., the vertically oriented sidewalls and the top upper surface of the fin (for a tri-gate device), form a surface inversion layer or "channel" that permits current conduction between the source and drain regions of the device 10. For a dual-gate device, an insulating material is positioned above the upper surface of the fins 14 such that the channel regions are only formed along the sidewalls of the fins 14. Due to the configuration of the fin and the configuration of the gate structure that wraps around three sides of the fin, there is better electrostatic control of the "fin" channel regions on FinFET devices.

Another known transistor device is typically referred to as a nanowire device. In a nanowire device, at least the channel region of the device is comprised of one or more very small diameter, wire-like semiconductor structures. As with the other types of transistor devices discussed above, current flow through a nanowire device is controlled by setting the voltage applied to the gate electrode. When an appropriate voltage is applied to the gate electrode, the channel region of the nanowire device becomes conductive, and electrical current is permitted to flow between the source region and the drain region through the conductive channel region, i.e., current flows through the nanowire structure. In a nanowire device, the gate structure is typically formed such that it wraps around the nanowire channel structure. Accordingly, such a nanowire device has even better gate control characteristics than that of a tri-gate FinFET device. Unfortunately, the process flows for making nanowire devices can be very complex and time consuming, thereby leading to increased processing complexity and increased manufacturing costs.

However, as device dimensions continue to shrink, device designers are compelled to look for novel designs of transistors that may provide better electrostatic control of the channel region of the devices. The present disclosure is directed to various methods of forming a FinFET device with a unique gate configuration, and the resulting FinFET semiconductor device, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a FinFET device with a unique gate configuration, and the resulting FinFET semiconductor device. One method disclosed includes, among other things, forming a plurality of trenches in a semiconductor substrate so as to define an overall fin structure having a stepped cross-sectional profile when viewed in a cross-section that is taken through the gate structure in a gate width direction of the device, the overall fin structure comprising an upper part and a lower part positioned under the upper part, wherein the upper part has a first width and the lower part has a second width that is less than the first width, forming a layer of insulating material in the plurality of trenches such that the upper part of the overall fin structure and a portion of the lower part of the overall fin structure are exposed above an upper surface of the layer of insulating material, and forming a gate structure around the exposed upper part of the overall fin structure and the exposed portion of the lower part of the overall fin structure.

Another illustrative method disclosed herein includes, among other things, performing a first etching process so as to define a first plurality of trenches in the substrate so as to define an upper part of an overall fin structure, wherein the first trenches have a first overall depth and wherein the upper part has a first width, forming a sidewall spacer adjacent the upper part of the overall fin structure, with the sidewall spacers in position, performing a second etching process to define a plurality of second trenches that are substantially self-aligned with respect to the sidewall spacers, wherein the second trenches have a second overall depth that is greater than the first overall depth and wherein the second trenches define a lower part of the overall fin structure with a second width that is greater than the first width, performing an isotropic etching process on the lower part of the overall fin structure to reduce a width of the lower part such that the reduced-width lower part of the overall fin structure has a third width that is less than the first width, forming a recessed layer of insulating material in at least the second trenches such that the upper part of the overall fin structure and a portion of the lower part of the overall fin structure is exposed above an upper surface of the recessed layer of insulating material, and forming a gate structure around the exposed upper part of the overall fin structure and the exposed portion of the lower part of the overall fin structure.

One illustrative device disclosed herein includes, among other things, an overall fin structure having a stepped cross-sectional profile when viewed in a cross-section taken through the overall fin structure in a gate width direction of the device, wherein the overall fin structure has an upper part and a lower part positioned under the upper part and wherein the upper part has a first width and the lower part has a second width that is less than the first width, a layer of insulating material positioned in trenches positioned adjacent the overall fin structure, wherein the upper part of the overall fin structure and a portion of the lower part of the overall fin structure are exposed above an upper surface of the layer of insulating material, and a gate structure positioned around the exposed upper part of the overall fin structure and the exposed portion of the lower part of the overall fin structure.

BRIEF DESCRIPTION OF THE DRAWINGS

The disclosure may be understood by reference to the following description taken in conjunction with the accompanying drawings, in which like reference numerals identify like elements, and in which:

FIGS. 2A-2L depict one illustrative method disclosed herein of forming a FinFET device with a unique gate configuration, and the resulting FinFET semiconductor device; and FIGS. 3A-3D depict another illustrative method disclosed herein of forming a FinFET device with a unique gate configuration, and the resulting FinFET semiconductor device.

Figure 1:
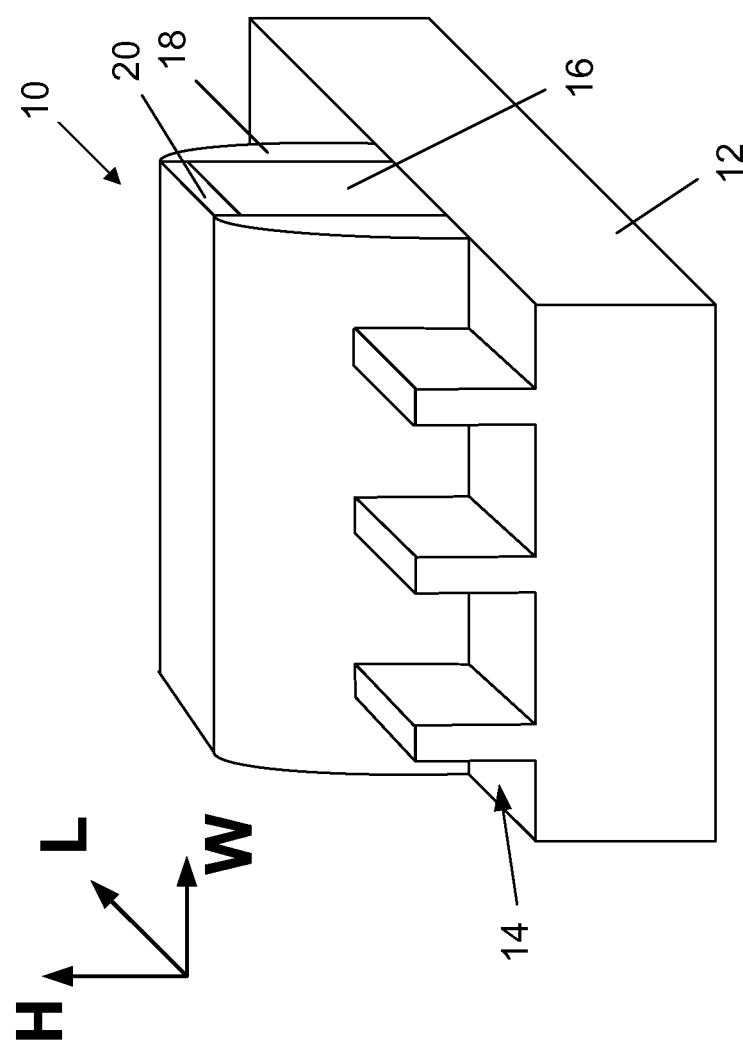
FIG. 1 is a perspective view of one illustrative embodiment of a prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a FinFET device with a unique gate configuration, and the resulting FinFET semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. As will be appreciated by those skilled in the art after a complete reading of the present application, the inventions disclosed herein may be employed in forming integrated circuit products using a variety of so-called 3D devices, such as FinFETs. For purposes of disclosure, reference will be made to an illustrative process flow wherein a single FinFET device 100 is formed. Moreover, the inventions will be disclosed in the context of forming the gate structures using a replacement gate ("gate-last") processing technique. Of course, the inventions disclosed herein should not be considered to be limited to the illustrative examples depicted and described herein. With reference to the attached figures, various illustrative embodiments of the methods and devices disclosed herein will now be described in more detail.

FIGS. 2A-2L depict one illustrative method disclosed herein of forming a FinFET device with a unique gate configuration, and the resulting FinFET semiconductor device. The illustrative device 100 will be formed in and above the semiconductor substrate 102. The device 100 may be either an NMOS or a PMOS transistor. Additionally, various doped regions, e.g., source/drain regions, halo implant regions, well regions and the like, are not depicted in the attached drawings. The substrate 102 may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials. The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIGS. 2A-2L present various views of one illustrative embodiment of a FinFET device 100 that may be formed using the methods disclosed herein. The drawings also include a simplistic plan view of the device 100 (in the upper right corner) that depicts the location where various cross-sectional views depicted in the following drawings will be taken. More specifically, the view "X-X" is a cross-sectional view that is taken through the long axis of a fin (i.e., in the current transport direction of the device); the view "Y-Y" is a cross-sectional view that is taken through the axial length of the gate electrode of the device (i.e., along the gate width direction of the device 100); and the view "Z-Z" is a cross-sectional view that is taken through the source/drain region of the device in a direction that is transverse to the long axis of the fins.

Figure 2A:
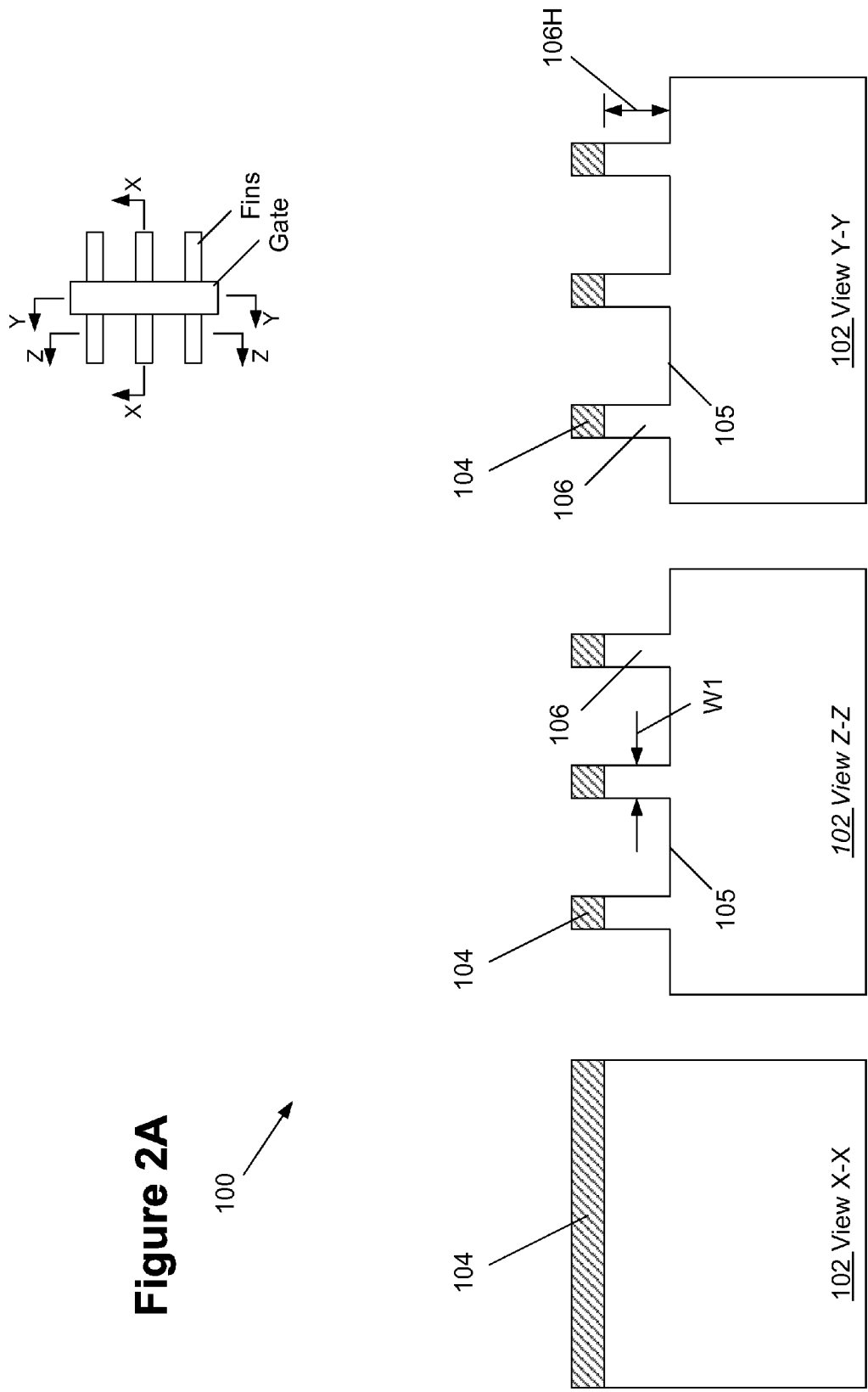

In general, the methods disclosed herein involve formation of an overall fin structure for a FinFET device 100, wherein the overall fin structure has a stepped cross-sectional profile when viewed in a cross-section that is taken through the gate structure in a gate width direction of the FinFET device. FIG. 2A depicts the device 100 at a point in fabrication wherein several process operations have been performed. First, a patterned etch mask 104, e.g., silicon nitride, was formed above the substrate 102. Thereafter, one or more etching processes were performed through the patterned etch mask 104 so as to define a plurality of initial trenches 105 in the substrate 102. This results in the formation of a plurality of initial fin structures 106 having a width W1 (in the gate width direction of the device 100). The initial fins 106 will constitute an upper part of the overall fin structure for the device 100. The illustrative FinFET device 100 disclosed herein will be depicted as being comprised of three illustrative overall fin structures. However, as will be recognized by those skilled in the art after a complete reading of the present application, the methods and devices disclosed herein may be employed when manufacturing FinFET devices having any number of fins. The fins extend laterally in the current transport direction and into what will become the source/drain regions of the device 100.

With continuing reference to FIG. 2A, the overall size, shape and configuration of the initial trenches 105 and overall fin structures may vary depending on the particular application. The depth and width of the initial trenches 105, as well as other trenches that will be formed in the substrate 102, may vary depending upon the particular application. In one illustrative embodiment, based on current day technology, the overall depth 106H (relative to the upper surface of the substrate 102) of the initial trenches 105 may range from approximately 20-50 nm. The width W1 of the initial fin structures 106, i.e., the upper part of the overall fin structures for the device 100, may be about 6-15 nm. In the illustrative examples depicted in the attached figures, the initial trenches 105, and the other trenches that will be formed in the substrate 102, as described more fully below, as well as the overall fin structure, will be simplistically depicted as having generally rectangular portions and sections. In an actual real-world device, the sidewalls of the initial trenches 105 may be somewhat inwardly tapered, although that configuration is not depicted in the drawings. Thus, the size and configuration of the various trenches and fin structures formed herein, and the manner in which they are made, should not be considered a limitation of the present invention. For ease of disclosure, only the substantially rectangular-shaped trenches and overall fin structures having substantially rectangular-shaped portions will be depicted in subsequent drawings.

Figure 2B:
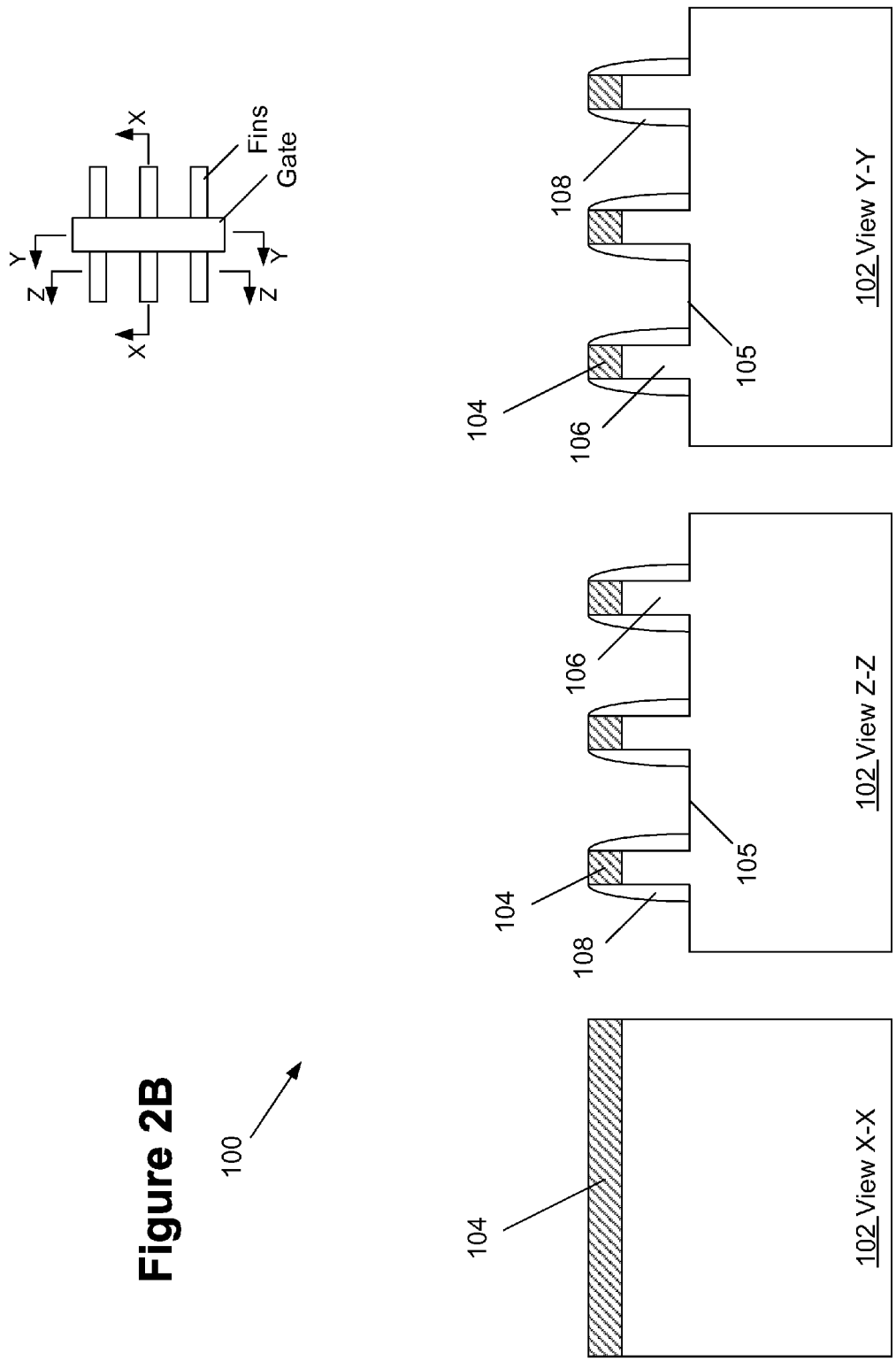

FIG. 2B depicts the device 100 after sidewall spacers 108 are formed adjacent the initial fin structures 106, i.e., adjacent the upper part of the overall fin structures for the device 100. The spacers 108 may be formed by depositing a layer of spacer material and thereafter performing an anisotropic etching process. In one embodiment, the spacers 108 may have a base width that falls within the range of about 3-6 nm.

Figure 2C:
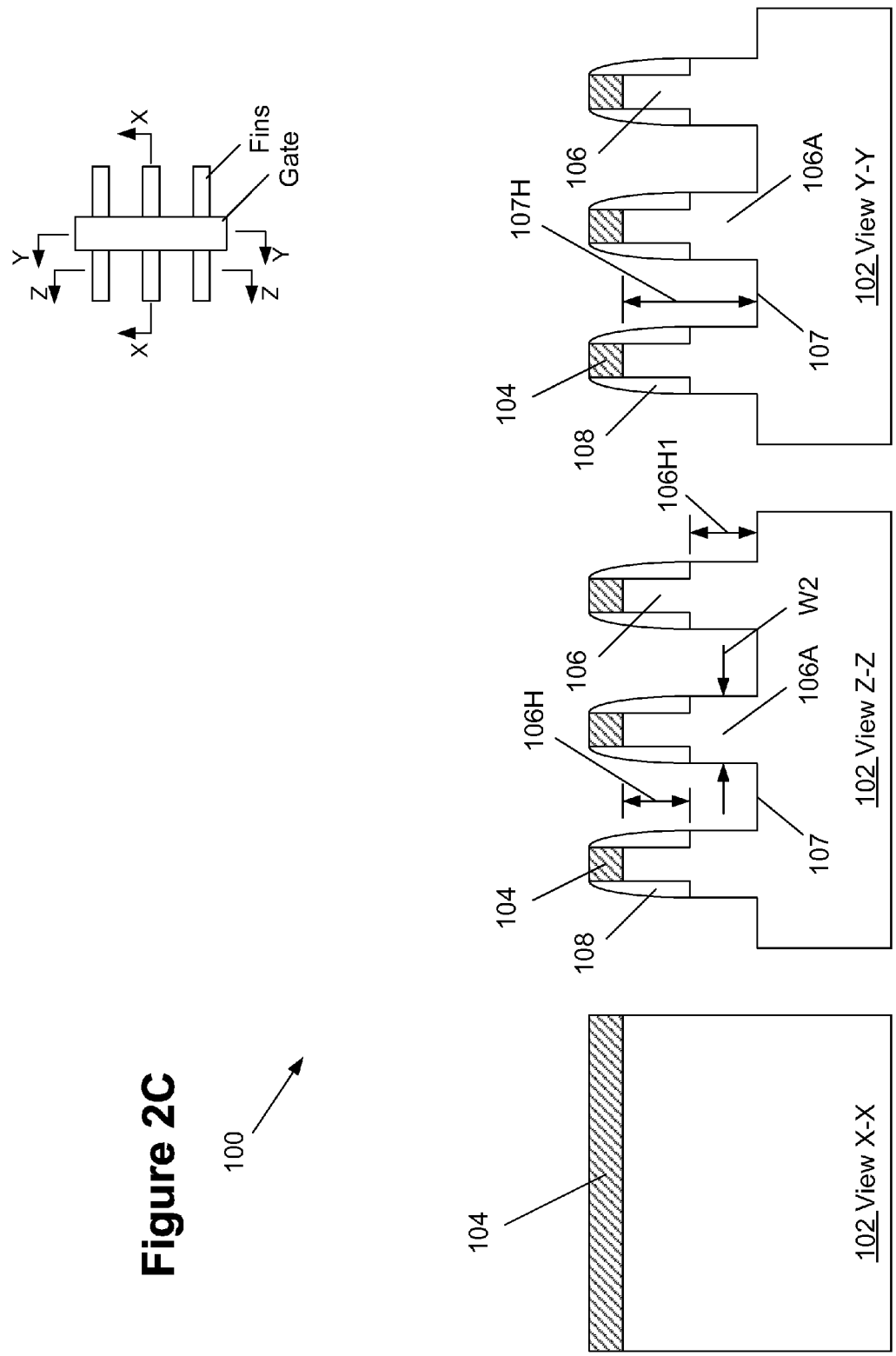

FIG. 2C depicts the device 100 after an anisotropic etching process was performed to form a plurality of second trenches 107 in the substrate 102. Note that the second trenches 107 are substantially self-aligned with the spacers 108. The formation of the second trenches 107 results in the formation of a lower portion 106A of the overall fin structure having a width W2 that is greater than the width W1 (see FIG. 2A). In one embodiment, the width W2 may fall within the range of about 12-27 nm. The height 106H1 of the lower portions 106A may also vary depending upon the particular application, e.g., about 15-50 nm. In one embodiment, the height 106H1 of the lower part 106A of the overall fin structure may be about the same as the overall height 106H of the upper part 106 of the overall fin structure. The overall depth 107H (relative to the upper surface of the substrate 102) of the trenches 107 may range from approximately 35-100 nm.

Figure 2D:
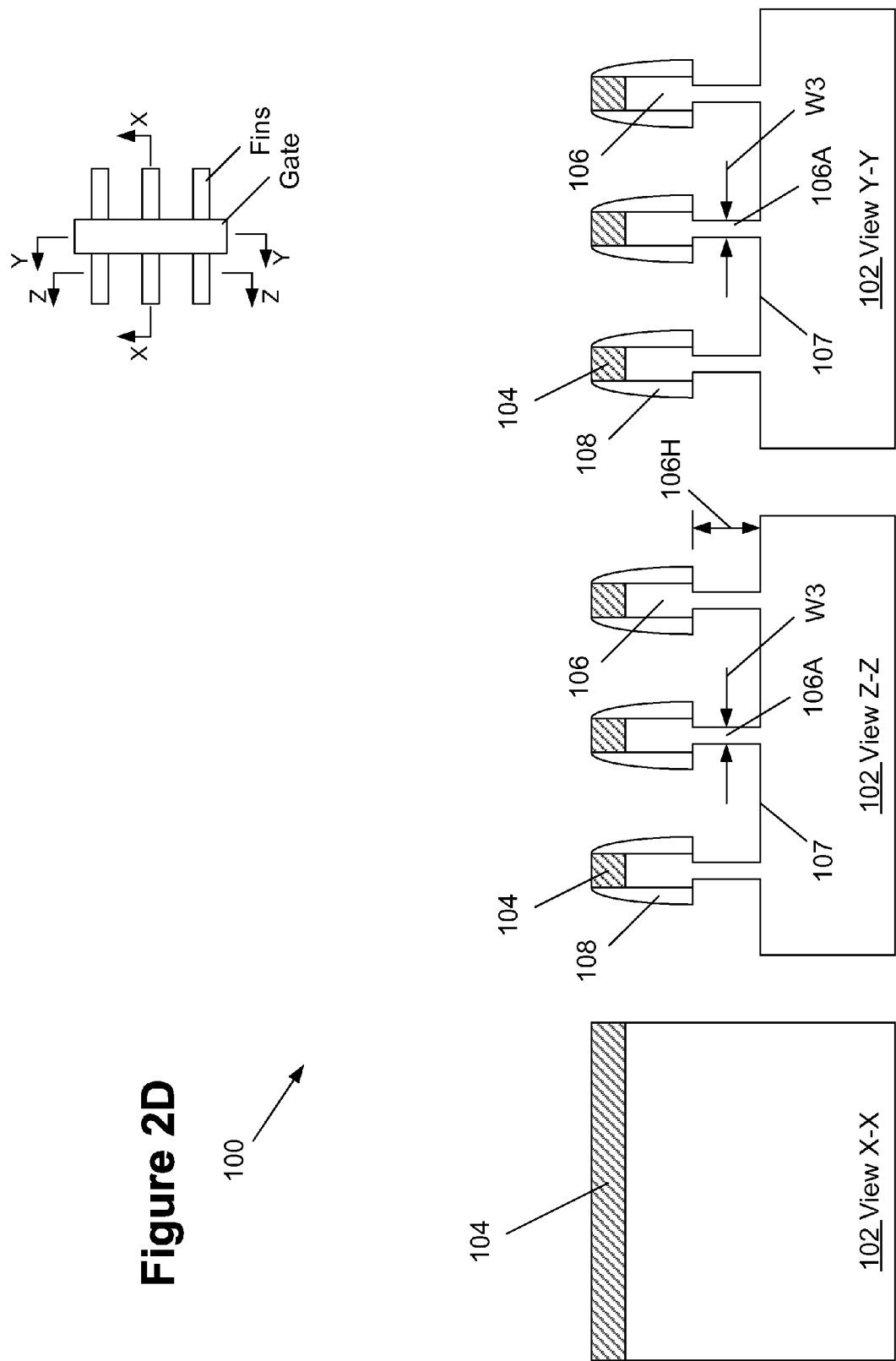

FIG. 2D depicts the device 100 after a timed, isotropic etching process was performed to reduce the initial width W2 (FIG. 2C) of the lower fin part 106A to a width W3 that is less that the width W1 (FIG. 2A) of the upper part 106 of the overall fin structure. In one embodiment, the width W3 may fall within the range of about 3-10 nm. In general, the width W3 may be targeted to be about 2-6 nm less than the width W1, or about 30-60% less than the width W1.

Figure 2E:
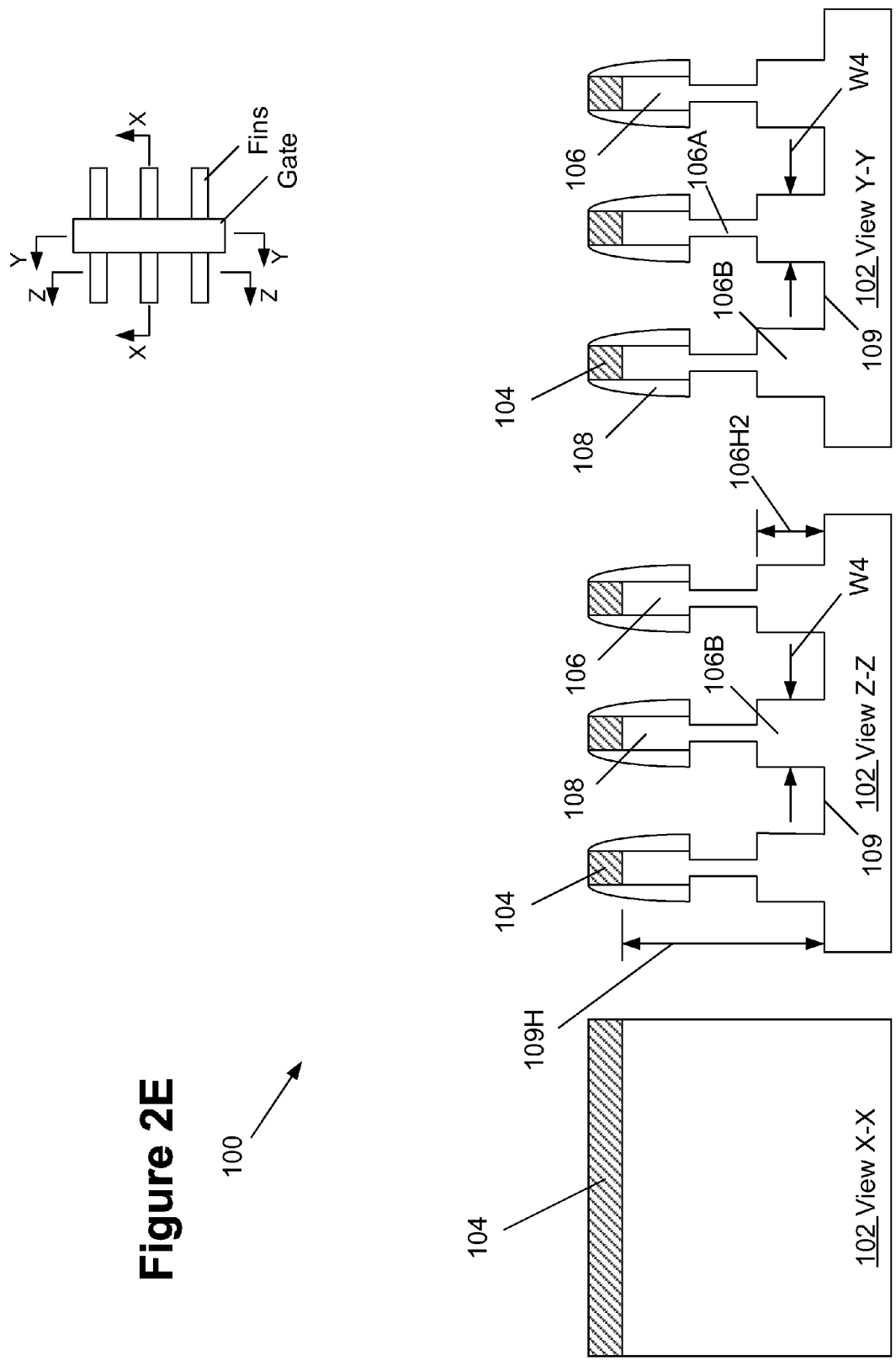

FIG. 2E depicts the device 100 after another anisotropic etching process was performed to form a plurality of third trenches 109 in the substrate 102. Note that the third trenches 109 are substantially self-aligned with the spacers 108. The formation of the third trenches 109 results in the formation of a bottom part 106B of the overall fin structure having a width W4 that is substantially equal to the width W2 (FIG. 2C). The height 106H2 of the portions 106B may also vary depending upon the particular application, e.g., about 10-160 nm. The overall depth 109H (relative to the upper surface of the substrate 102) of the trenches 109 may range from approximately 80-200 nm. One advantage of the process flow disclosed herein is related to the depth, width and formation sequence of the various trenches depicted herein. For example, if the trenches 107 in FIG. 2D were etched too deeply, the structure would likely become unstable. By keeping the depth of the trenches 107 relatively shallow, and by forming the wider portions 106B below the portions 106A, a fin with a very narrow fin width W3 (FIG. 2D) may be formed on a more stable structure.

Figure 2F:
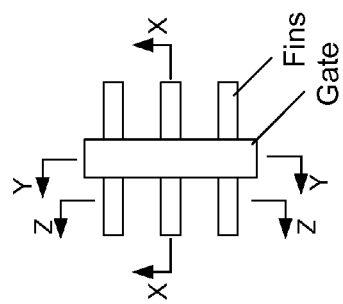
Figure 2F:
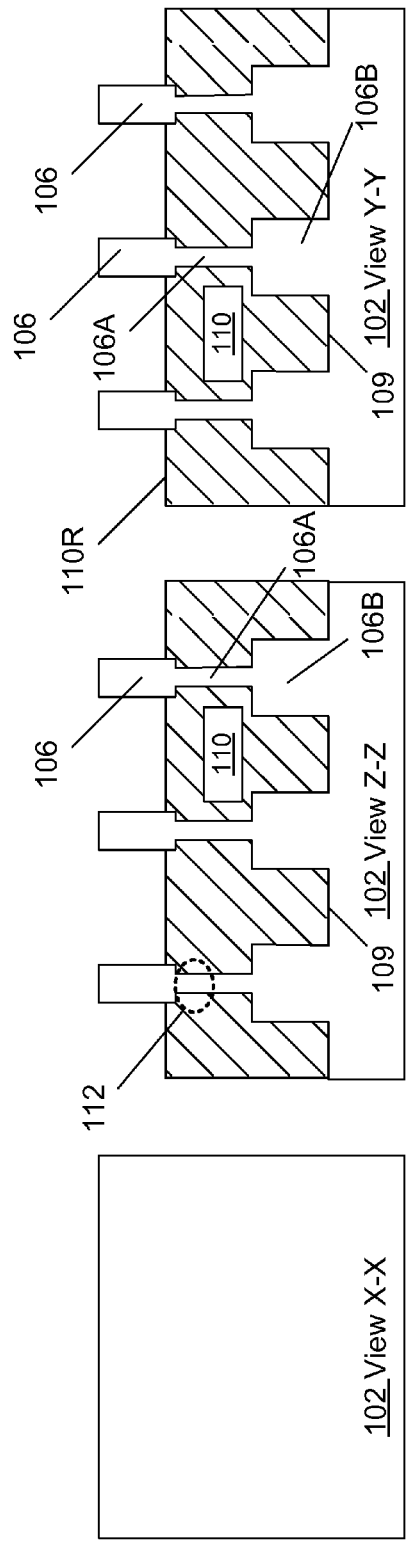

FIG. 2F depicts the device 100 after several process operations were performed. First, the spacers 108 and the patterned etch mask 104 were removed. Thereafter, a recessed layer of insulating material 110, e.g., silicon dioxide, was formed between the overall fin structures 106. The recessed layer of insulating material 110 may be formed by over-filling the trenches with an insulating material, performing a CMP process on the layer of insulating material that stops on the upper surface of the initial fin structures 106, and performing a recess etching process on the layer of insulating material 110 so as to recess the upper surface 110R of the layer of insulating material 110 to a desired height level. In one embodiment, the recessed layer of insulating material 110 is recessed to the point that its upper recessed surface 110R is positioned at a level such that the lower part 106A of the overall fin structures remain covered. However, in other cases, the recessed upper surface 110R may be level with or below the upper surface of the lower portion 106A. The area in the dashed-line region 112 will be the location where so-called punch through implants may be positioned.

In the example disclosed herein, the FinFET device 100 will be formed using a replacement gate technique. Accordingly, FIG. 2G depicts the device 100 at a point in fabrication wherein several process operations have been performed. More specifically, a sacrificial gate structure 114 has been formed above the substrate 102 and around portions of the fins 106. Also depicted is an illustrative gate cap layer 116 and sidewall spacers 118. The gate cap layer 116 and the sidewall spacers 118 are typically made of silicon nitride. The source/drain regions for the device are formed outside of the spacers 118, in the region depicted in view Z-Z. At this point in the replacement gate process flow, an anneal process would have already been performed to activate the implanted dopant materials and repair any damage to the substrate 102 due to the various ion implantation processes that were performed. The sacrificial gate structure 114 includes a sacrificial gate insulation layer (not separately shown) and a dummy or sacrificial gate electrode (not separately shown). The sacrificial gate insulation layer may be comprised of silicon dioxide and the sacrificial gate electrode may be comprised of polysilicon or amorphous silicon. The sacrificial gate structure 114 is intended to be representative in nature.

FIG. 2H depicts the device 100 after an epi semiconductor material 122 has been formed in the source/drain regions of the device. The epi material 122 may be doped or undoped. In the case of a doped epi material 122, the doped epi material 122 may be formed by performing an in-situ doped epi process or by performing one or more conventional ion implantation processes. The epi material can be formed directly on the exposed fin or after the fin has been recessed, as indicated by the recesses 120. The epi material can be merged or unmerged. The diamond-shaped configuration of the epi material 122 in the source/drain regions (view Z-Z) is due to the crystallographic structure of the substrate 102. The outline of the fins prior to the formation of the epi material 122 in the source/drain regions is depicted by the dashed-lines 106X.

Figure 2I:
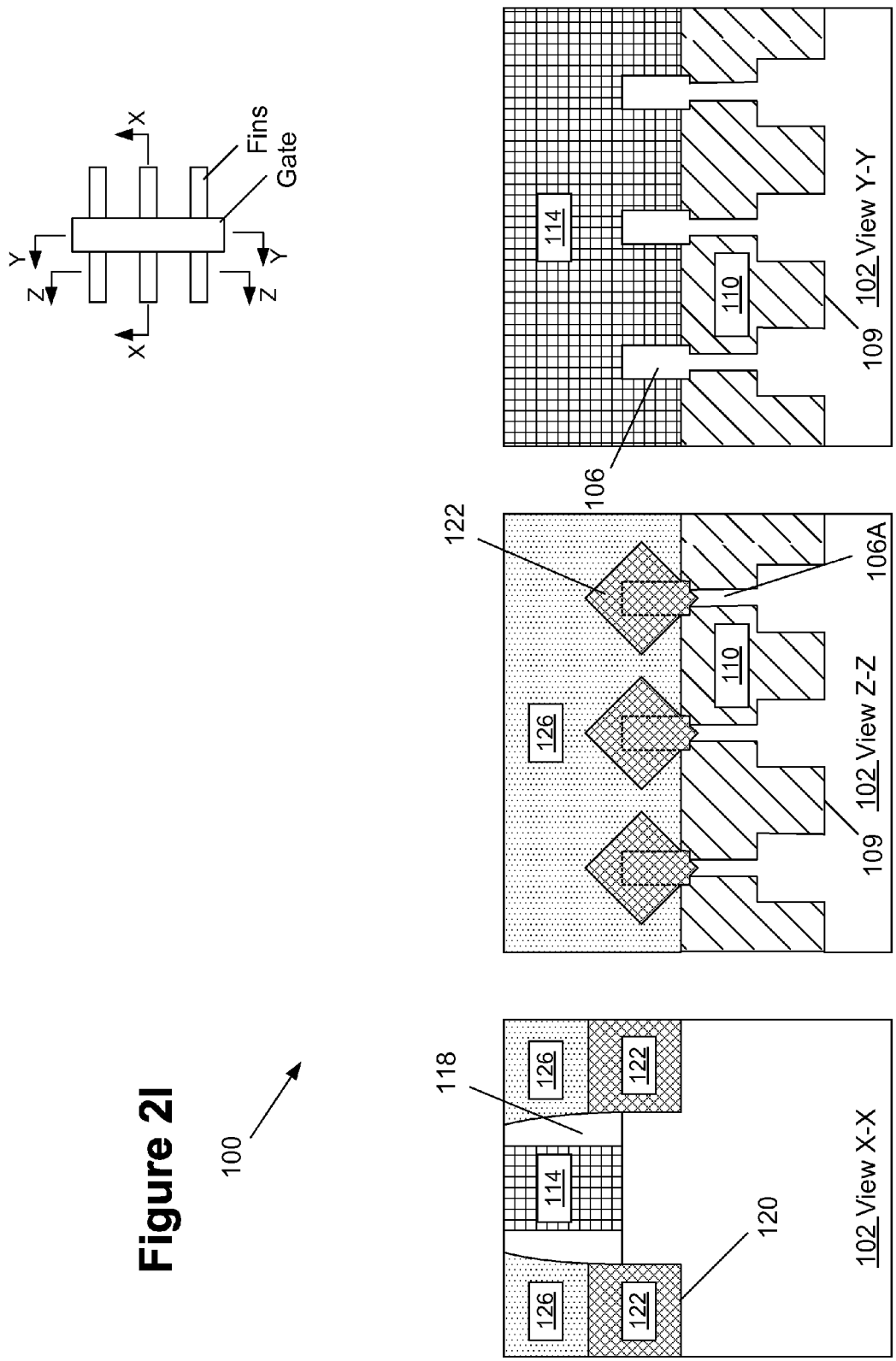

FIG. 2I depicts the device 100 after several process operations were performed. First, a layer of insulating material 126 was deposited above the device 100 and a CMP process was then performed to planarize the upper surface of the layer of insulating material 126 with the upper surface of the sacrificial gate structure 114. These process operations expose the upper surface of the sacrificial gate structure 114, i.e., the upper surface of the sacrificial gate electrode, so that it may be removed.

Figure 2J:
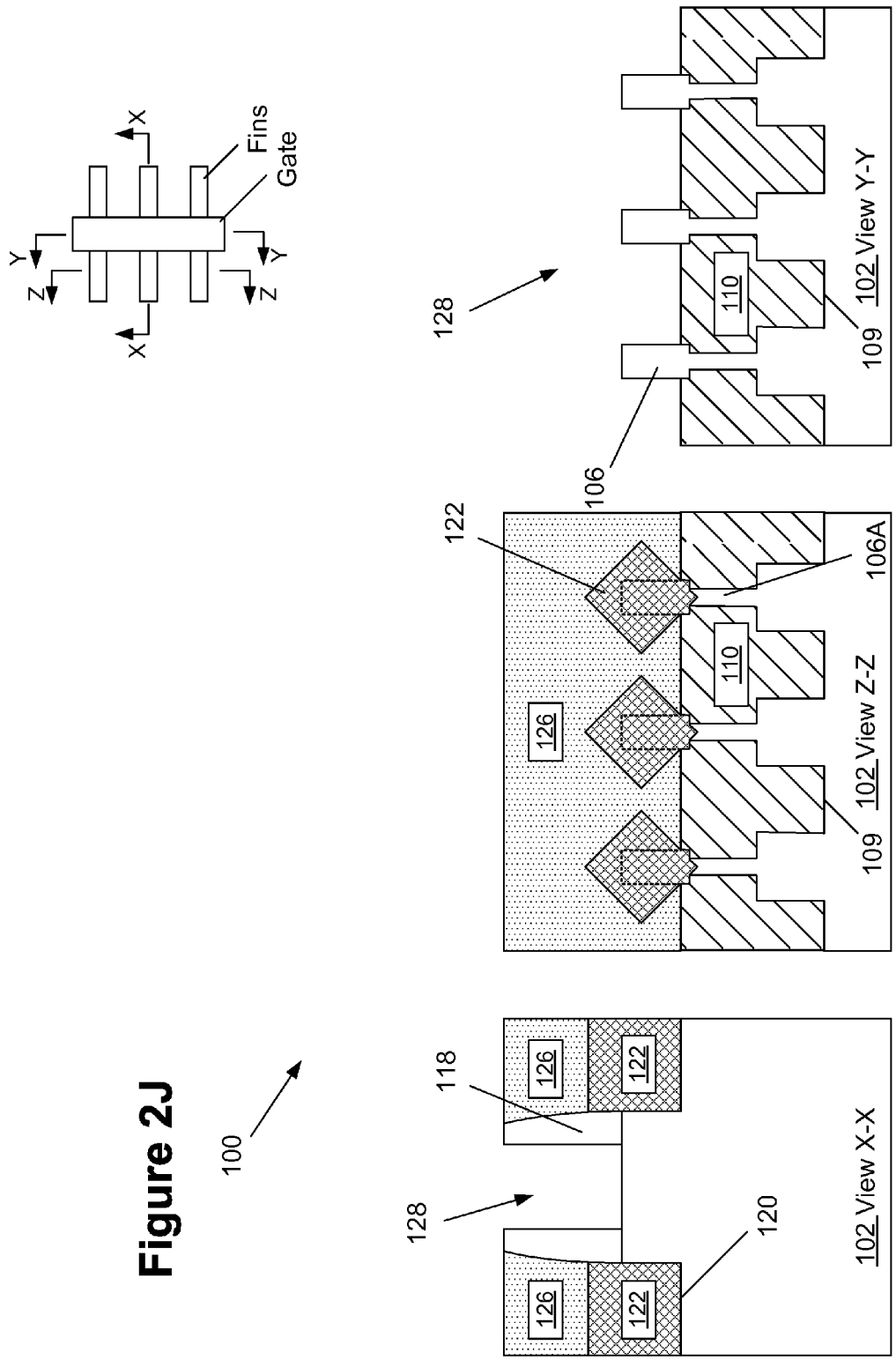

FIG. 2J depicts the device 100 after one or more wet or dry etching processes were performed to remove the sacrificial gate structure 114 so as to thereby define a replacement gate cavity 128 where a replacement or final gate structure will subsequently be formed for the device 100.

FIG. 2K depicts the device 100 after a recess etching process was performed on the recessed layer of insulating material 110 so as to further recess the upper surface of the layer of insulating material 110 to a desired height level. In one embodiment, this recess etching process results in the layer of insulating material 110 having a further recessed surface 110X such that at least a portion of the lower part 106A of the overall fin structures is exposed, while other portions of the lower part 106A remain covered. In some cases, this additional recess etching process may not need to be performed, i.e., the initial recessing of the layer of insulating material 110 to reveal the fins may be sufficient. The amount of recessing may vary depending upon the application. In one illustrative embodiment, after the recessing process shown in FIG. 2K is completed, the lower part 106A of the overall fin structure may have an exposed height 106H2 above the recessed layer of insulating material 110 that falls within the range of about 5-20 nm.

Thereafter, several known processing operations were performed to form a schematically depicted replacement gate structure 130 in the gate cavity 128, as depicted in FIG. 2L. The replacement gate structure 130 depicted herein is intended to be representative in nature of any type of gate structure that may be employed in manufacturing integrated circuit products using so-called gate-last (replacement gate) manufacturing techniques. The replacement gate structure 130 typically comprises a high-k gate insulation layer 130A (k value greater than 10), such as hafnium oxide, and one or more metal layers 130B. Typically, the various layers of material that will be present in the replacement gate structure 130 are sequentially deposited in the gate cavity 128 and above the layer of insulating material 126 and one or more CMP processes are performed to remove excess portions of the gate materials positioned outside of the gate cavity 128. Then, one or more etching processes were performed to remove upper portions of the various materials within the cavity 128 so as to form the replacement gate structure 130 and to form a recess above the replacement gate structure 130. Then, the gate cap layer 132 was formed in the recess above the recessed gate materials. The gate cap layer 132 is typically comprised of silicon nitride and it may be formed by depositing a layer of gate cap material so as to over-fill the recess formed in the gate cavity 128 above the recessed replacement gate structure 130 and thereafter performing a CMP process to remove excess portions of the gate cap material layer positioned above the surface of the layer of insulating material 126. The gate cap layer 132 is formed so as to protect the underlying gate materials during subsequent processing operations. The gate structure 130 is intended to be representative in nature as it represents any type of replacement gate structure that may be employed in manufacturing transistor devices.

FIG. 2L also contains an enlarged cross-sectional view of a portion (indicated in the dashed-line region 140) of one of the fins of the device 100. As depicted, the overall fin structure has a stepped cross-sectional profile (when viewed in the depicted cross-section), wherein the upper part 106 of the overall fin structure has a first width W1 that is wider than the width W3 of the lower part 106A of the overall fin structure. As depicted in view Y-Y, in the depicted example, the bottom part 106B of the overall fin structure has a width W4 (approximately equal to W2 (FIG. 2C)) that is greater that each of the widths W1 and W3. In general, the gate structure depicted in FIG. 2L may be referred to as an "Omega" gate structure, in view of the configuration of the Greek letter omega (Ω). That is, the gate structure 130 is positioned around the upper surface 106U, the side surfaces 106-1 of the upper part 106 of the overall fin structure and under a region 106Y of the upper part 106. As such, the FinFET device with the illustrative gate structure depicted herein provides more control of the channel region of the device 100 as compared to a prior art tri-gate or double-gate FinFET device, while still employing manufacturing techniques that may be readily integrated into production activities.

At the point of fabrication depicted in FIG. 2L, traditional manufacturing process operations may be performed to complete the manufacture of the device, i.e., the formation of source/drain contact structures, the formation of various metallization layers, etc.

Figure 3B:
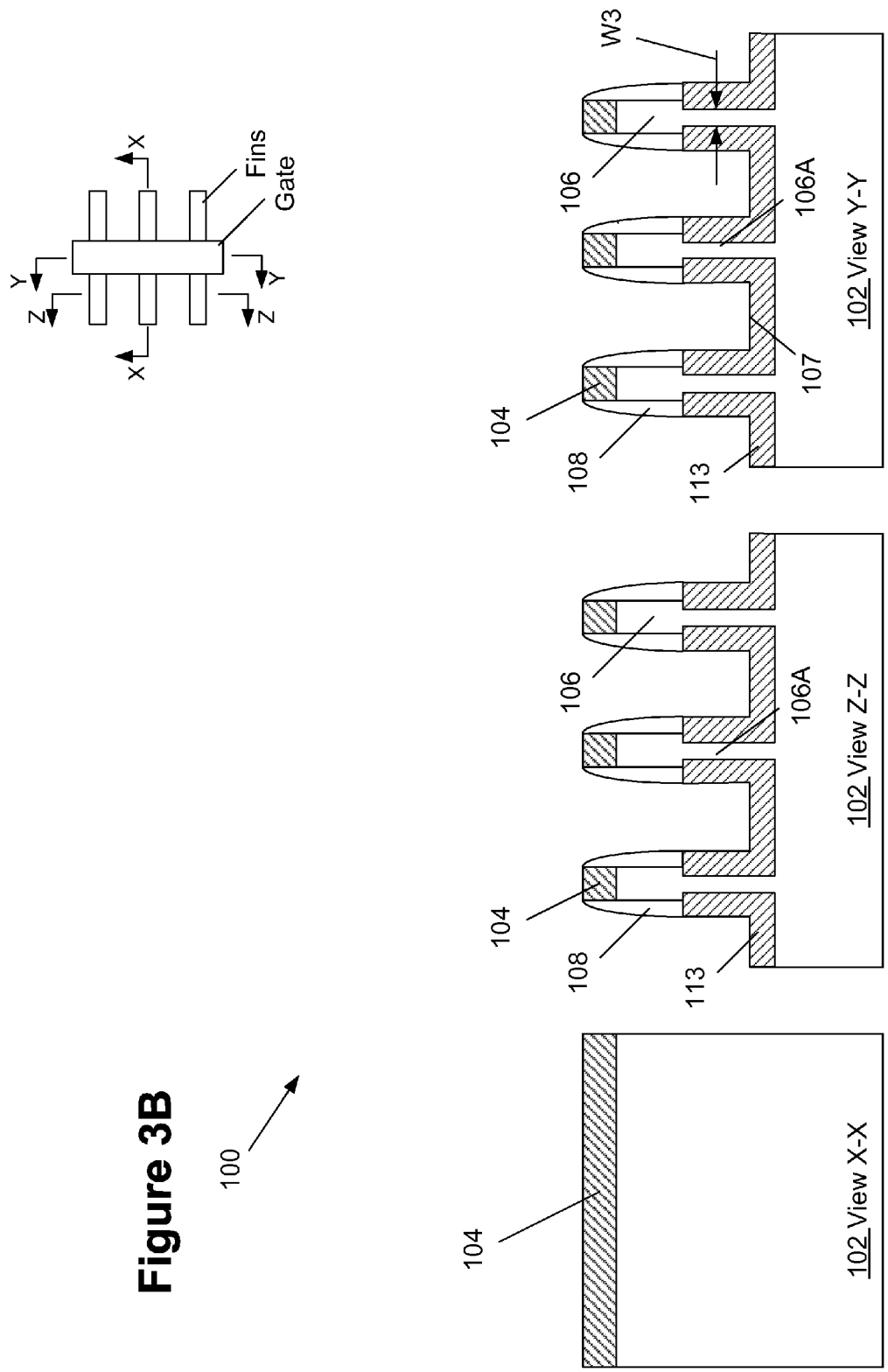

FIGS. 3A-3D depict another illustrative method disclosed herein of forming a FinFET device with a unique gate configuration, and the resulting FinFET semiconductor device. FIG. 3A depicts the device 100 at a point in fabrication that corresponds to that shown in FIG. 2C, i.e., after formation of the trenches 107.

FIG. 3B depicts the device 100 after an oxidation process was performed to form an oxide layer 113 in the trenches 107 and on the sidewalls of the lower fin portion 106A. The thickness of the oxide layer 113 may vary depending upon the particular application. In one embodiment, the oxidation process is performed until such time as the portion 106A has a width (i.e., fin thickness) of W3. Note that since only a portion of what will become the overall fin structure is oxidized in this process flow, maintaining fin straightness should not be a significant issue.

FIG. 3C depicts the device 100 after one or more anisotropic etching processes were performed to form the above-described third trenches 109 in the substrate 102. Note that the third second trenches 109 are substantially self-aligned with the spacers 108. As before, the formation of the third trenches 109 results in the formation of a bottom part 106B of the overall fin structure.

Figure 3D:
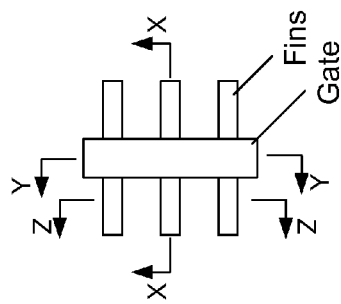
Figure 3D:
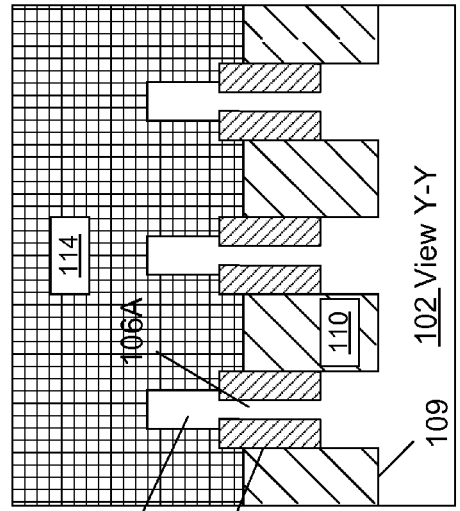
Figure 3D:
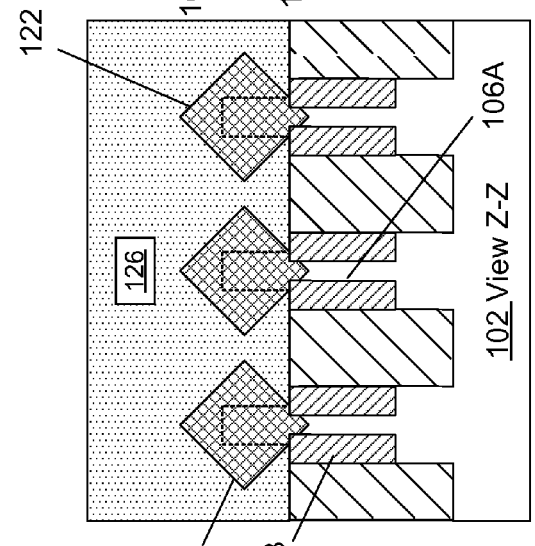
Figure 3D:
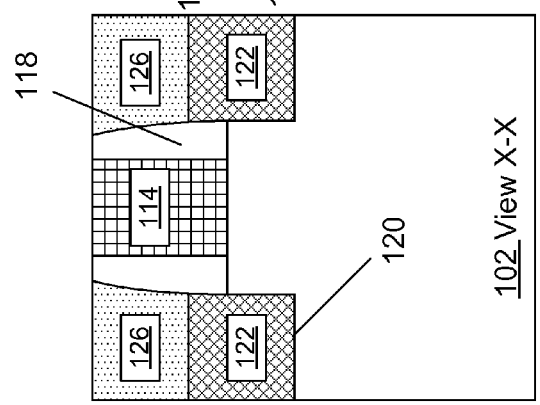

At the point of fabrication depicted in FIG. 3C, the device may be completed by performing the same process operations as previously described above. For example, FIG. 3D depicts the device 100 at a point in fabrication that corresponds to that shown in FIG. 2I, i.e., after the formation of the sacrificial gate structure 114 and after the epi semiconductor material 122 was formed in the source/drain regions of the device. Using the process flow described above, the final gate structure 130 may ultimately be formed for the device 100 depicted in FIG. 3D.

As will be appreciated by those skilled in the art after a complete reading of the present application, the FinFET device 100 depicted in FIG. 2L has a unique structure and provides unique benefits relative to prior art FinFET devices. More specifically, due to the stepped profile of the overall fin structure, the gate structure 130 is positioned around the upper part 106 and at least a portion of the lower part 106A of the overall fin structure. Such a configuration provides more control of the channel region(s) of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Note that the use of terms, such as "first," "second," "third" or "fourth," to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device with a gate structure, comprising:
    forming a plurality of trenches in a semiconductor substrate so as to define an overall fin structure having a stepped cross-sectional profile when viewed in a cross-section that is taken through said gate structure in a gate width direction of said device, said overall fin structure comprising an upper part and a lower part positioned under said upper part, wherein said upper part has a first width and said lower part has a second width that is less than said first width and wherein forming said plurality of trenches in said semiconductor substrate so as to define said overall fin structure comprises:
        performing a first etching process so as to define a first plurality of trenches in said semiconductor substrate so as to define said upper part of said overall fin structure, said first plurality of trenches having a first overall depth;
        forming a sidewall spacer adjacent said upper part of said overall fin structure;
        with said sidewall spacer in position, performing a second etching process to define a plurality of second trenches that are substantially self-aligned with respect to said sidewall spacers, wherein said plurality of second trenches have a second overall depth that is greater than said first overall depth and wherein said plurality of second trenches define said lower part of said overall fin structure having a third width that is greater than said first width of said upper part of said overall fin structure; and
        performing an isotropic etching process on said lower part with said third width to reduce its thickness and thereby define said lower part of said overall fin structure with said second width;
    forming a layer of insulating material in said plurality of trenches such that said upper part of said overall fin structure and a portion of said lower part of said overall fin structure are exposed above an upper surface of said layer of insulating material; and
    forming a gate structure around said exposed upper part of said overall fin structure and said exposed portion of said lower part of said overall fin structure.

2. The method of claim 1, wherein performing said first etching process comprises performing a first anisotropic etching process.

3. The method of claim 2, wherein performing said second etching process comprises performing a second anisotropic etching process.

4. The method of claim 3, further comprising, prior to forming said layer of insulating material, the method further comprises, with said sidewall spacers in position, performing a third anisotropic etching process to define a plurality of third trenches that are substantially self-aligned with respect to said sidewall spacers, wherein said plurality of third trenches have an overall third depth that is greater than said second depth.

5. The method of claim 1, wherein a height of said upper part of said overall fin structure and a height of said lower part of said overall fin structure are substantially the same.

6. The method of claim 1, wherein said gate structure comprises a gate insulation layer comprised of a high-k insulating material and a gate electrode comprised of at least one layer of metal.

7. The method of claim 1, wherein, prior to forming said gate structure, the method comprises removing said sidewall spacers.

8. A method of forming a FinFET device with an overall fin structure, comprising:
   performing a first etching process so as to define a first plurality of trenches in a semiconductor substrate so as to define an upper part of said overall fin structure, wherein said first plurality of trenches have a first overall depth and wherein said upper part of said overall fin structure has a first width;
   forming a sidewall spacer adjacent said upper part of said overall fin structure;
   with said sidewall spacers in position, performing a second etching process to define a plurality of second trenches that are substantially self-aligned with respect to said sidewall spacers, wherein said plurality of second trenches have a second overall depth that is greater than said first overall depth and wherein said plurality of second trenches define a lower part of said overall fin structure with a second width that is greater than said first width;
   performing an isotropic etching process on said lower part of said overall fin structure to reduce a width of said lower part such that said reduced-width lower part of said overall fin structure has a third width that is less than said first width;
   forming a recessed layer of insulating material in at least said plurality of second trenches such that said upper part of said overall fin structure and a portion of said lower part of said overall fin structure are exposed above an upper surface of said recessed layer of insulating material; and
   forming a gate structure around said exposed upper part of said overall fin structure and said exposed portion of said lower part of said overall fin structure.

9. The method of claim 8, wherein performing said first etching process comprises performing a first anisotropic etching process.

10. The method of claim 9, wherein performing said second etching process comprises performing a second anisotropic etching process.

11. The method of claim 8, further comprising, prior to forming said recessed layer of insulating material, the method further comprises, with said sidewall spacers in position, performing a third anisotropic etching process to define a plurality of third trenches that are substantially self-aligned with respect to said sidewall spacers, wherein said third plurality of trenches have a third overall depth that is greater than said second overall depth.

12. The method of claim 8, wherein a height of said upper part of said overall fin structure and a height of said lower part of said overall fin structure are substantially the same.

13. The method of claim 8, wherein, prior to forming said gate structure, the method comprises removing said sidewall spacers.

14. A method of forming a FinFET device with a gate structure, comprising:
   forming a plurality of trenches in a semiconductor substrate so as to define an overall fin structure having a stepped cross-sectional profile when viewed in a cross-section that is taken through said gate structure in a gate width direction of said device, said overall fin structure comprising an upper part and a lower part positioned under said upper part, wherein said upper part has a first width and said lower part has a second width that is less than said first width and wherein forming said plurality of trenches in said semiconductor substrate so as to define said overall fin structure having said stepped cross-sectional profile comprises:
      performing a first etching process so as to define a first plurality of trenches in said semiconductor substrate so as to define said upper part of said overall fin structure, said first plurality of trenches having a first overall depth;
      forming a sidewall spacer adjacent said upper part of said overall fin structure;
      with said sidewall spacer in position, performing a second etching process to define a plurality of second trenches that are substantially self-aligned with respect to said sidewall spacers, wherein said plurality of second trenches have a second overall depth that is greater than said first overall depth and wherein said plurality of second trenches define said lower part of said overall fin structure having a third width that is greater than said first width of said upper part of said overall fin structure; and
      performing an oxidation process so as to form an oxide layer on the sidewalls of said lower part with said third width to reduce its thickness and thereby define said lower part of said overall fin structure with said second width;
   forming a layer of insulating material in said plurality of trenches such that said upper part of said overall fin structure and a portion of said lower part of said overall fin structure are exposed above an upper surface of said layer of insulating material; and
   forming a gate structure around said exposed upper part of said overall fin structure and said exposed portion of said lower part of said overall fin structure.

15. The method of claim 14, wherein performing said first etching process comprises performing a first anisotropic etching process.

16. The method of claim 14, further comprising, with said sidewall spacers in position, performing at least one anisotropic etching process to remove portions of said oxide layer positioned on a bottom surface of said plurality of second trenches and to define a plurality of third trenches that are substantially self-aligned with respect to said sidewall spacers, wherein said plurality of third trenches have an overall third depth that is greater than said second depth.

* * * * *